(12) United States Patent
Iwamuro

(10) Patent No.: US 8,431,991 B2
(45) Date of Patent: Apr. 30, 2013

(54) SEMICONDUCTOR DEVICE

(75) Inventor: Noriyuki Iwamuro, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 598 days.

(21) Appl. No.: 12/265,728

(22) Filed: Nov. 5, 2008

(65) Prior Publication Data

US 2009/0114923 A1    May 7, 2009

(30) Foreign Application Priority Data

Nov. 7, 2007   (JP) .................. 2007-289767

(51) Int. Cl.
*H01L 29/24*    (2006.01)
*H01L 20/78*    (2006.01)

(52) U.S. Cl.
USPC .............. 257/341; 257/370; 257/E29.256; 257/E29.104; 257/29.262

(58) Field of Classification Search .......... 257/341, 257/E29.256, 370, 77, E29.262, E29.104
See application file for complete search history.

(56) References Cited

U.S. PATENT DOCUMENTS 6,180,958 B1    1/2001  Cooper, Jr.
2002/0179976 A1*  12/2002  Takahashi .............. 257/370

FOREIGN PATENT DOCUMENTS

| JP | 11-087698 A | 3/1999 |
|---|---|---|
| JP | 11-87698 A | 3/1999 |
| JP | 2001-511315 A | 8/2001 |
| JP | 2002-185015 A | 6/2002 |
| WO | 02/49114 A2 | 6/2002 |

OTHER PUBLICATIONS

Notification of Reasons for Refusal for corresponding JP 2007-289767. Mail date Dec. 11, 2012. Partial translation provided.

* cited by examiner

*Primary Examiner* — Matthew Reames
(74) *Attorney, Agent, or Firm* — Rossi, Kimms & McDowell LLP

(57) ABSTRACT

A semiconductor device includes a peripheral voltage withstanding structure, which includes an $n^-$ SiC layer, an n SiC layer and a p SiC layer are provided successively on an $n^+$ SiC layer. A trench is formed in the peripheral voltage withstanding structure portion so that the trench passes through the p SiC layer 15 and the n SiC layer 14 and reaches the $n^-$ SiC layer. This trench is wider than a trench having a trench gate structure in the active region portion. A $p^+$ SiC region is provided along a bottom of the trench so as to be located under the trench. A sidewall and the bottom of the trench are covered with an oxide film and an insulating film having a total thickness not smaller than 1.1 μm. The oxide film and insulating film absorb a large part of a voltage applied between a source and a drain.

10 Claims, 10 Drawing Sheets

SEMICONDUCTOR DEVICE

BACKGROUND OF THE INVENTION

The present invention relates to a semiconductor device and particularly relates to a high withstand voltage semiconductor device produced from a semiconductor material (hereinafter referred to wide bandgap semiconductor) having a wider bandgap than that of silicon.

Wide bandgap semiconductors such as silicon carbide (hereinafter referred to as SiC), gallium nitride (hereinafter referred to as GaN), etc. have recently attracted a great deal of attention as semiconductor materials for power semiconductor devices. The wide bandgap semiconductors potentially break the characteristic limit of silicon which is a conventional semiconductor material. On the other hand, SiC or GaN has a disadvantage that it is very difficult to form P-type regions by an ion injection method. Although it has been reported that SiC turned p type when aluminum (Al) or gallium (Ga) ions were injected into SiC at a high temperature, it is impossible to form sufficient p-type regions because resistance is very high. That is, it is difficult for the wide bandgap semiconductor to form p-type regions selectively in an n-type substrate. For this reason, it is very difficult to provide a guard ring in a peripheral voltage withstanding structure portion surrounding an active region portion in which a drift current flows.

Therefore, a bevel structure is known as a peripheral voltage withstanding structure of a semiconductor device (hereinafter referred to as wide bandgap semiconductor device) formed of a wide bandgap semiconductor. Incidentally, in this specification and accompanying drawings, each technical term showing a layer or region and headed by "n" or "p" means that electrons or positive holes are majority carriers. Each superscript "+" or "−" given to "n" or "p" means that the concentration of an impurity is higher or lower than the concentration of the impurity in a layer or region described without any superscript.

FIG. 13 is a sectional view showing the configuration of a peripheral voltage withstanding structure portion of a bevel structure in an MOSFET (insulated gate field effect transistor). As shown in FIG. 13, the peripheral voltage withstanding structure portion 1 has a structure (bevel structure) in which an element edge side portion (right half part in FIG. 13) of p and p$^+$ layers 3 and 4 epitaxially grown on an n$^-$ layer 2 has been removed by dry etching. In this structure, a large leak current flows if a depletion layer comes in contact with a dicing side surface 5 when a high withstand voltage is applied between a source and a drain. To prevent the large leak current from flowing, an n$^+$ region 6 is provided in the element edge portion so that the depletion layer can be restrained from being stretched.

A structure in which an element edge side end surface of a p-type layer is provided as an inclined surface (e.g. see JP-A-2002-185015 and its corresponding International Application WO 02/49114 A2) is also commonly known as a structure similar to the aforementioned structure. A structure in which trenches surrounding an active region portion are formed so that a p+ layer is provided between the bottom of each trench and the trench (e.g. see JP-A-11-87698) is further commonly known as another peripheral voltage withstanding structure.

The peripheral voltage withstanding structure disclosed in JP-A-2002-185015, however, has the following problems. Firstly, since the element withstand voltage depends on the taper angle of the inclined surface, high controllability is required of the dry etching. Secondly, it is necessary to prevent the inclined surface and the surface of the n$^-$ layer from being damaged by the dry etching. Because of these requirements, it is difficult to produce a semiconductor device having a desired element withstand voltage at a good yield rate. Moreover, it is difficult to obtain sufficiently high reliability for a long term. Thirdly, it is necessary to provide the n$^+$ region in the element edge portion. Fourthly, the length of the peripheral voltage withstanding structure portion becomes large, that is, the length from a boundary between the active region portion and the peripheral voltage withstanding structure portion to the dicing side surface becomes large. Since there is no current flowing in the peripheral voltage withstanding structure portion, it is preferable that the length of the peripheral voltage withstanding structure portion is made as short as possible to thereby increase the area of the active region portion to improve efficiency of the whole element.

SUMMARY OF THE INVENTION

The present invention provides a semiconductor device which is configured so that the semiconductor device can be produced easily to solve the problems in the background art. The invention further provides a semiconductor device which is excellent in long-term reliability. The invention still further provides a semiconductor device having a short peripheral voltage withstanding structure portion.

To solve the problems discussed above, the semiconductor device according to the invention is produced from a wide bandgap semiconductor and includes a peripheral voltage withstanding structure portion provided outside the active region portion in which an electric current flows, wherein the peripheral voltage withstanding structure portion is characterized as follows. On a first semiconductor layer of a first conductivity type, a second semiconductor layer of the first conductivity type is provided. The second semiconductor layer of the first conductivity type has a higher impurity concentration than that of the first semiconductor layer of the first conductivity type. A third semiconductor layer of a second conductivity type is further provided on the second semiconductor layer of the first conductivity type. At least one trench is formed in the peripheral voltage withstanding structure portion. The trench passes through the third semiconductor layer of the second conductivity type and the second semiconductor layer of the first conductivity type and reaches the first semiconductor layer of the first conductivity type. An inner surface of the trench is covered with an insulating film.

The number of trenches provided in the peripheral voltage withstanding structure portion may be only one. A fourth semiconductor layer of the second conductivity type may be provided along a bottom of the trench so as to be located under the trench. The fourth semiconductor layer of the second conductivity type may be provided along only a part of the bottom of the trench. When the gate structure of the active region portion is a gate trench structure in which a control electrode is embedded in the trench through a gate insulating film, it is preferable that the width of the trench provided in the peripheral voltage withstanding structure portion is wider than that of the trench provided in the active region portion.

According to the invention, the semiconductor device can be easily produced to improve reliability because the invention can dispense with high controllability for forming an inclined surface of a bevel structure. Since the insulating film in the trench in the peripheral voltage withstanding structure portion absorbs a large part of a voltage applied between a source and a drain, the length of the peripheral voltage withstanding structure portion can be shortened so as to be approximately equal to the width of the trench in the peripheral voltage withstanding structure portion. Since the second semiconductor layer of the first conductivity type in the peripheral voltage withstanding structure portion serves as a stopper of a depletion layer, it is unnecessary to provide a depletion layer stretching prevention region (region equivalent to the n+ region in the background art) in an element edge portion. When the fourth semiconductor layer of the second conductivity type is provided along the bottom of the trench, the depletion later can be spread stably to improve the element withstand voltage.

In the semiconductor device according to the invention, there is an effect that the semiconductor device can be produced easily. There is another effect that the semiconductor device is excellent in long-term reliability. There is a further effect that a peripheral voltage withstanding structure portion of the semiconductor device can be made short.

BRIEF DESCRIPTION OF THE DRAWINGS

The invention has been described with reference to certain preferred embodiments thereof and the accompanying drawings, wherein.

DESCRIPTION OF THE PREFERRED EMBODIMENTS

Preferred embodiments of the invention as to a semiconductor device will be described below in detail with reference to the accompanying drawings. In the following description of embodiments and accompanying drawings, like numerals refer to like parts to omit duplicate description.

Embodiment 1

Figure 1:
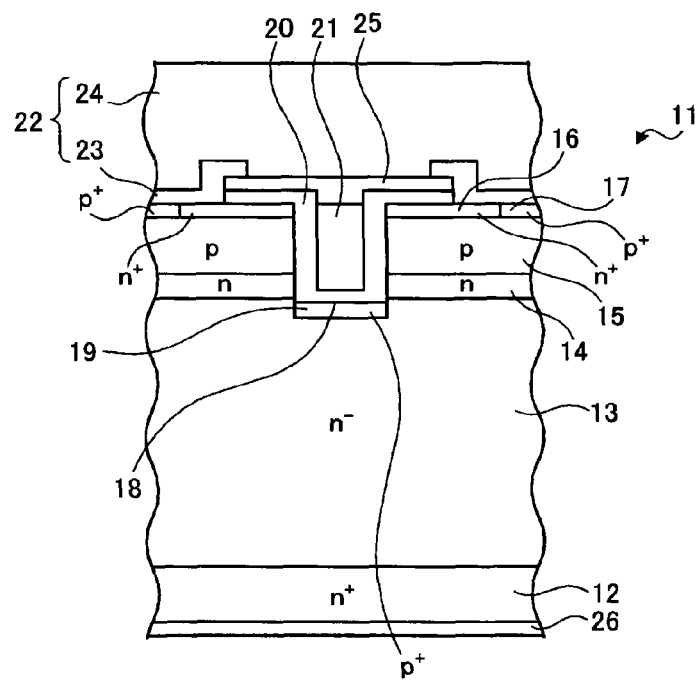
FIG. 1 is a sectional view showing the configuration of an active region portion of a semiconductor device according to the first embodiment of the invention.
Figure 2:
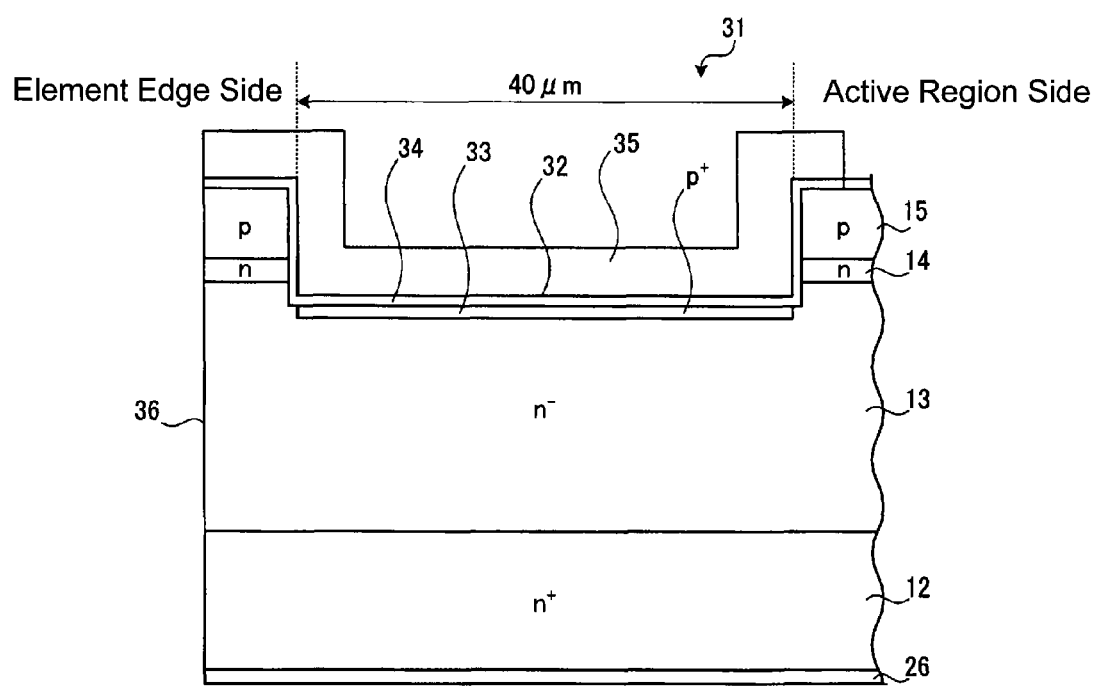
FIG. 2 is a sectional view showing the configuration of a peripheral voltage withstanding structure portion of the semiconductor device according to a first embodiment of the invention.

FIGS. 1 and 2 are sectional views showing respective configurations of an active region portion and a peripheral voltage withstanding structure portion in a semiconductor device according to a first embodiment of the invention. Description will be made on the case where a trench gate MOSFET of 1200V withstand voltage class is taken as an example though the semiconductor device is not particularly limited to the trench gate MOSFET. The active region portion and the peripheral voltage withstanding structure portion are formed in one and the same semiconductor substrate so that the outside of the active region portion is surrounded by the peripheral voltage withstanding structure portion. The semiconductor device is produced from SiC. A first conductivity type is an n type, and a second conductivity type is a p type.

As shown in FIG. 1, in the active region portion 11, an n− SiC layer 13 is provided on an n+ SiC layer 12. For example, the n+ SiC layer 12 contains about $2 \times 10^{18}$ cm$^{-3}$ of nitrogen (N) as an impurity. For example, the n− SiC layer 13 contains about $1.0 \times 10^{16}$ cm$^{-3}$ of nitrogen as an impurity. For example, the thickness of the n− SiC layer 13 is about 10 μm.

An n SiC layer 14 is provided on the n− SiC layer 13. For example, the n SiC layer 14 contains about $2.0 \times 10^{17}$ cm$^{-3}$ of nitrogen as an impurity. For example, the thickness of the n SiC layer 14 is about 0.5 μm. A p SiC layer 15 is provided on the n SiC layer 14. For example, the p SiC layer 15 contains about $2.1 \times 10^{17}$ cm$^{-3}$ of aluminum as an impurity. For example, the thickness of the p SiC layer 15 is about 2.5 μm.

An n+ source region 16 and a p+ contact region 17 are individually selectively provided on the p SiC layer 15. For example, the n+ source region 16 contains phosphorus (P) as an impurity. For example, the p+ contact region 17 contains aluminum as an impurity. Trenches 18, which pass through the n+ source region 16, the p SiC layer 15 and the n SiC layer 14 and reach the n− SiC layer 13, are formed as gate trenches at intervals, for example, of 5 μm. For example, the width and depth of each trench 18 are 1.2 μm and 3 μm respectively.

For example, a p+ SiC region 19 is provided along the bottom of each trench 18 so as to be located under the trench 18. For example, the p+ SiC region 19 contains about $2.0 \times 10^{19}$ cm$^{-3}$ of aluminum as an impurity. Since the provision of the p+ SiC region 19 permits a depletion layer to be diffused stably when a high voltage is applied between a source and a drain, an oxide film (a part of a gate oxide film), for example, located in the bottom of each trench 18 can be prevented from being destroyed by electric field concentration into the bottom of the trench 18. That is, the element withstand voltage is improved.

A gate oxide film 20 is provided along the sidewall and bottom of each trench 18 so as to be located as a gate insulating film in the inside of the trench 18. For example, the thickness of the gate oxide film 20 is 100 nm. The inside of each trench 18 surrounded by the gate oxide film 20 is filled with a gate electrode 21 which serves as a control electrode. A source electrode 22 is in contact with the n+ source region 16 and the p+ contact region 17. The source electrode 22 has a double layer structure composed of a nickel (Ni) film 23 and an aluminum film 24.

To keep good contact characteristic between the source electrode 22 and the n+ source region 16, the nickel film 23 is in contact with the n+ source region 16. An interlayer insulating film 25 is provided between the gate electrode 21 and the source electrode 22. A drain electrode is in contact with the n+ SiC layer 12. The drain electrode is made of a nickel film to keep good contact characteristic with the n+ SiC layer 12.

As shown in FIG. 2, in the peripheral voltage withstanding structure portion 31, a semiconductor-laminated structure composed of an n+ SiC layer 12, an n− SiC layer 13, an n SiC layer 14 and a p SiC layer 15 and a drain electrode 26 are provided in the same manner as in the active region portion 11. The n+ SiC layer 12 and the n− SiC layer 13 are equivalent to a first semiconductor layer. The n SiC layer 14 is equivalent to a second semiconductor layer. The p SiC layer 15 is equivalent to a third semiconductor layer.

For example, one trench 32, which passes through the p SiC layer 15 and the n SiC layer 14 and reaches the n− SiC layer 13, is formed. The width of the trench 32 is wider than that of each trench 18 in the active region portion 11. For example, the width of the trench 32 is 40 μm. For example, the depth of the trench 32 is 3 μm. For example, a p+ SiC region is provided along the bottom of the trench 32 so as to be located under the trench 32.

A p+ SiC region 33 may be provided along the whole bottom of the trench 32 or may be provided only along a part of the bottom of the trench 32 except corners of the trench 32. For example, the p+ SiC region 33 is provided as a 39 μm-long portion along the bottom of the trench 32 except the corners of the trench 32. For example, the p+ SiC region 33 contains about $2.0 \times 10^{19}$ cm$^{-3}$ of aluminum as an impurity. The p+ SiC region 33 is equivalent to a fourth semiconductor layer.

The sidewall and bottom of the trench 32 are covered with an insulating film such as an oxide film, a silicon nitride film, etc. In this example, the insulating film is an oxide film 34. The oxide film 34 is covered with an insulating film 35. For example, the insulating film 35 is made of polyimide. The oxide film 34 and the insulating film 35 extend to an element edge side dicing side surface 36. For example, it is preferable that the total thickness of the oxide film 34 and the insulating film 35 is not smaller than 1.1 μm. This reason will be described later. In this example, for example the thickness of the oxide film 34 and the thickness of the insulating film 35 are 0.1 μm and 10 μm respectively.

When, for example, aluminum is injected into the n− SiC layer 13 by an ion injection method to form the p+ SiC region 33, aluminum is hardly diffused even by heat treatment after the ion injection. Accordingly, the p+ SiC region 33 may be formed not along the whole bottom of the trench 32 but only along a part of the bottom of the trench 32. In this case, there is a possibility that element destruction may be caused by an electric field concentrated into a part of the peripheral voltage withstanding structure portion 31 such as a corner of the trench 32 when a high withstand voltage is applied. To prevent the element destruction, it is necessary that the total thickness of the insulating film (including the oxide film 34 and the insulating film 35) in the trench 32 is not smaller than a certain thickness.

According to an inventor's experiment in which an element withstand voltage was measured while the thickness of the insulating film (polyimide) 35 was changed in a range of from 0.5 μm to 15 μm in the condition that the thickness of the oxide film 34 was set at 0.1 μm, it was found that a withstand voltage of about 1260 V is obtained when the thickness of polyimide is not smaller than 1 μm, but the withstand voltage is lowered rapidly when the thickness of polyimide is smaller than 1 μm. This is caused by destruction of the insulating film due to an electric field concentrated into a corner of the trench 32 when the insulating film as a combination of the oxide film 34 and the insulating film 35 is too thin because the breakdown electric field intensity of SiC is one-digit larger than that of silicon and equal to that of SiO$_2$. It was found from this result that a sufficient large withstand voltage can be obtained if the thickness of the insulating film as a combination of the oxide film 34 and the insulating film 35 is not smaller than 1.1 μm. Therefore, the thickness of the insulating film for covering the trench 32 of the peripheral voltage withstanding structure portion 31 is made not smaller than 1.1 μm.

Figure 3:
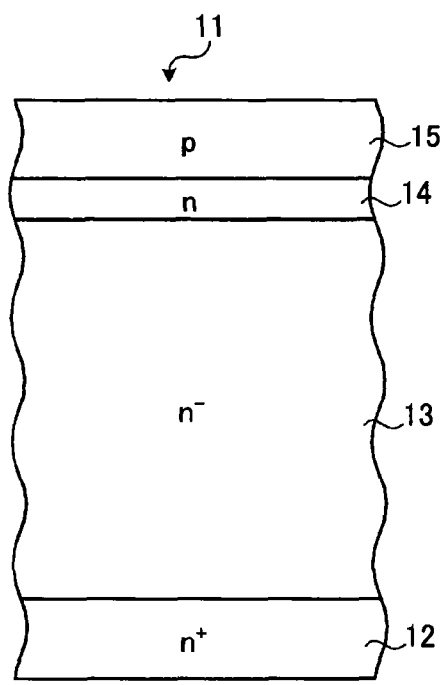
FIG. 3 is a sectional view showing an intermediate state of production of the semiconductor device according to a first embodiment of the invention.
Figure 4:
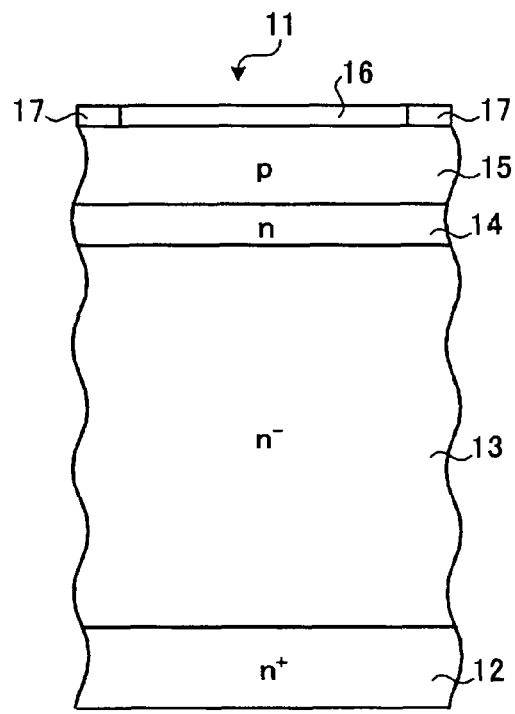
FIG. 4 is a sectional view showing an intermediate state of production of the semiconductor device according to a first embodiment of the invention.
Figure 5:
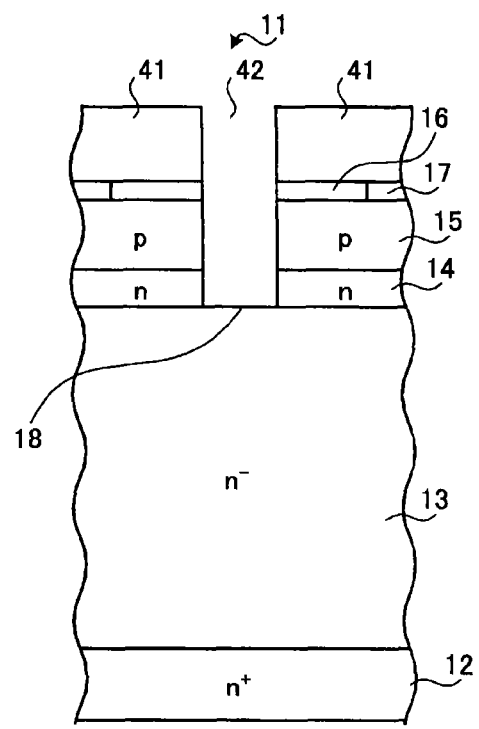
FIG. 5 is a sectional view showing an intermediate state of production of the semiconductor device according to a first embodiment of the invention.
Figure 6:
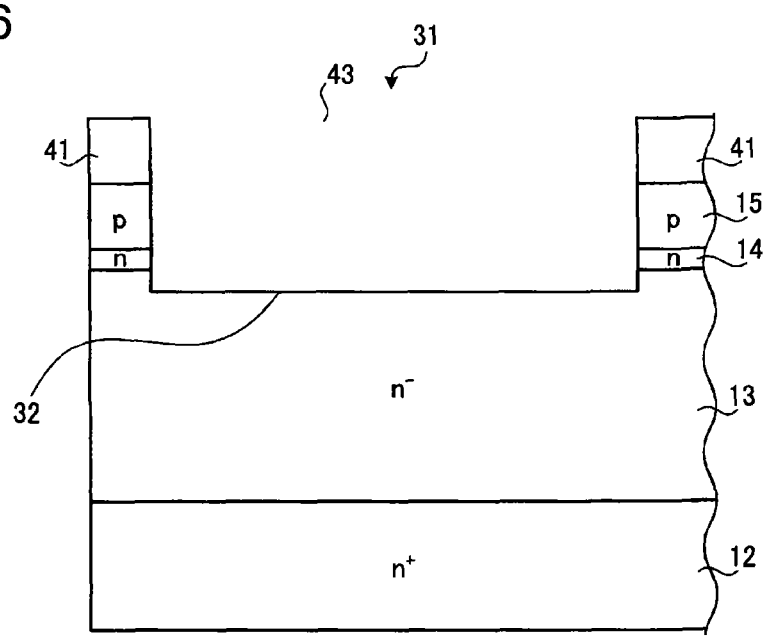
FIG. 6 is a sectional view showing an intermediate state of production of the semiconductor device according to a first embodiment of the invention.
Figure 7:
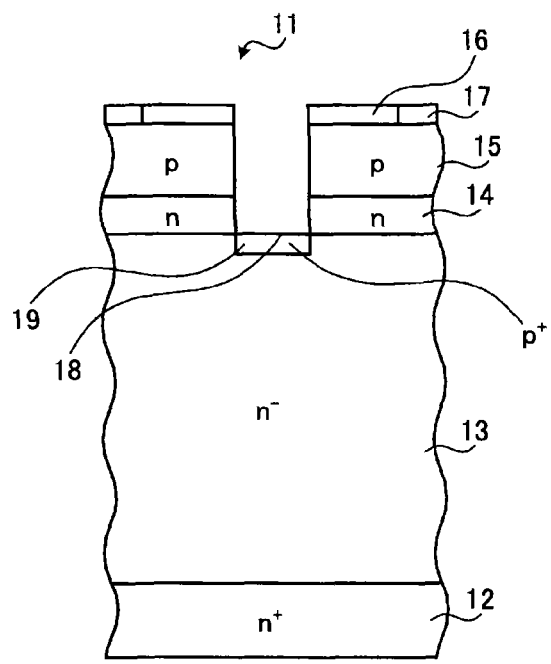
FIG. 7 is a sectional view showing an intermediate state of production of the semiconductor device according to a first embodiment of the invention.
Figure 8:
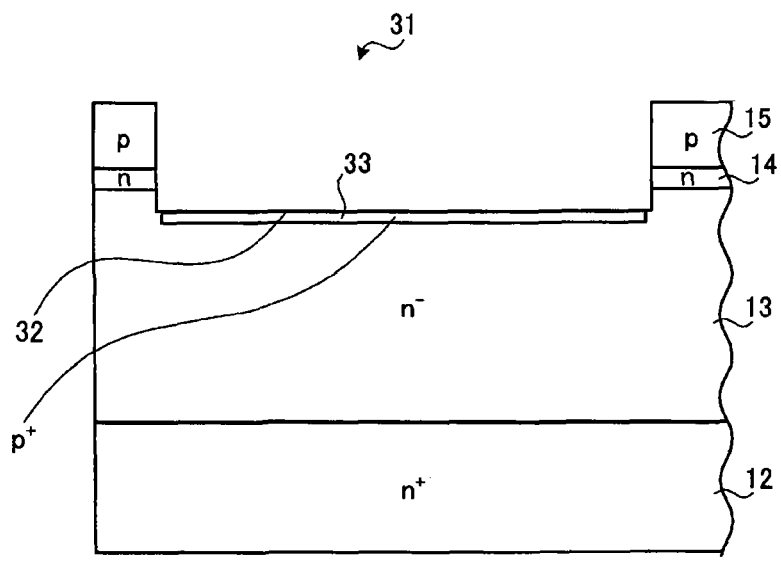
FIG. 8 is a sectional view showing an intermediate state of production of the semiconductor device according to a first embodiment of the invention.

FIGS. 3 to 8 are sectional views showing intermediate states of production of the semiconductor device according to the first embodiment of the invention. FIGS. 3 to 5 and FIG. 7 show the configuration of the active region portion. FIGS. 6 and 8 show the configuration of the peripheral voltage withstanding structure portion. First, an n-type SiC semiconductor substrate, for example, containing about $2 \times 10^{18}$ cm$^{-3}$ of nitrogen is prepared as shown in FIG. 3. The n+ SiC substrate is provided as an n+ SiC layer 12. In the active region portion 11 and the peripheral voltage withstanding structure portion, an n− SiC layer 13, an n SiC layer 14 and a p SiC layer 15 are epitaxially grown in this order on the n+ SiC substrate. The impurity type, impurity concentration and thickness of each layer are as described above.

Then, as shown in FIG. 4, in the active region portion 11, for example, aluminum and phosphorus are selectively injected into a surface of the p SiC layer 15, for example, by an ion injection method. Then, heat treatment is performed, for example, at 1700° C. for 1 minute to form a p+ contact region 17 and an n+ source region 16 selectively. Then, as shown in FIGS. 5 and 6, a silicon oxide film is grown, for example, to a thickness of 1.6 μm on surfaces of the p SiC layer 15, the n+ source region 16 and the p+ contact region 17 in the active region portion 11 and the peripheral voltage withstanding structure portion 31.

The silicon oxide film is photolithographed and etched to form an oxide film mask 41 for trench etching. In the active region portion 11, the oxide film mask 41 is provided with opening portions 42, for example, each of which is 1.2 μm wide and which are disposed at intervals of 5 μm. In the peripheral voltage withstanding structure portion 31, the oxide film mask 41 is provided with an opening portion 43 having a width of 40 μm wide, for example. Trench etching is performed by use of the oxide film mask 41 to form trenches 18, for example, 1.2 μm wide and 3 μm deep in the active region portion 11 (FIG. 5) and form a trench 32, for example, 40 μm wide and 3 μm deep in the peripheral voltage withstanding structure portion 31 (FIG. 6).

Then, as shown in FIGS. 7 and 8, a thermal oxide film is formed in the inside of each of the trenches 18 and 32 in the active region portion 11 and the peripheral voltage withstanding structure portion 31. After the thermal oxide film is patterned, for example, aluminum is injected into the bottom of each of the trenches 18 and 32, for example, by an ion injection method. For example, in the peripheral voltage withstanding structure portion 31, ions are injected into a 39 μm-long portion along the bottom of the trench 32 except corners of the trench 32.

Then, heat treatment is performed, for example, at 1700° C. for 1 minute to form a p+ SiC region 19 in the bottom of each of the trenches 18 in the active region portion 11 and form a p+ SiC region 33 in the bottom of the trench 32 in the peripheral voltage withstanding structure portion 31. The impurity kind and impurity concentration in each of the p+ SiC regions 19 and 33 are as described above. Then, the thermal oxide film is removed. Respective states of the active region portion 11 and the peripheral voltage withstanding structure portion 31 on this occasion are shown in FIGS. 7 and 8.

Then, as shown in FIGS. 1 and 2, an oxide film is grown in the active region portion 11 and the peripheral voltage withstanding structure portion 31. The oxide film serves as a gate oxide film 20 in the active region portion 11 and serves as an oxide film 34 for covering the sidewall and bottom of the trench 32 in the peripheral voltage withstanding structure portion 31. Accordingly, the thickness of the oxide film grown on this occasion is, for example, 100 nm. Successively, in the active region portion 11, a gate electrode 21 is embedded in the inside of each trench 18 and then an interlayer insulating film 25, a source electrode 22 (a nickel film 23 and an aluminum film 24) and a drain electrode 26 are formed. On the other hand, in the peripheral voltage withstanding structure portion 31, the oxide film 34 is covered with an insulating film 35. Finally, the semiconductor device is covered with a passivation film (not shown) to complete an MOSFET having the configuration shown in FIGS. 1 and 2.

Figure 13:
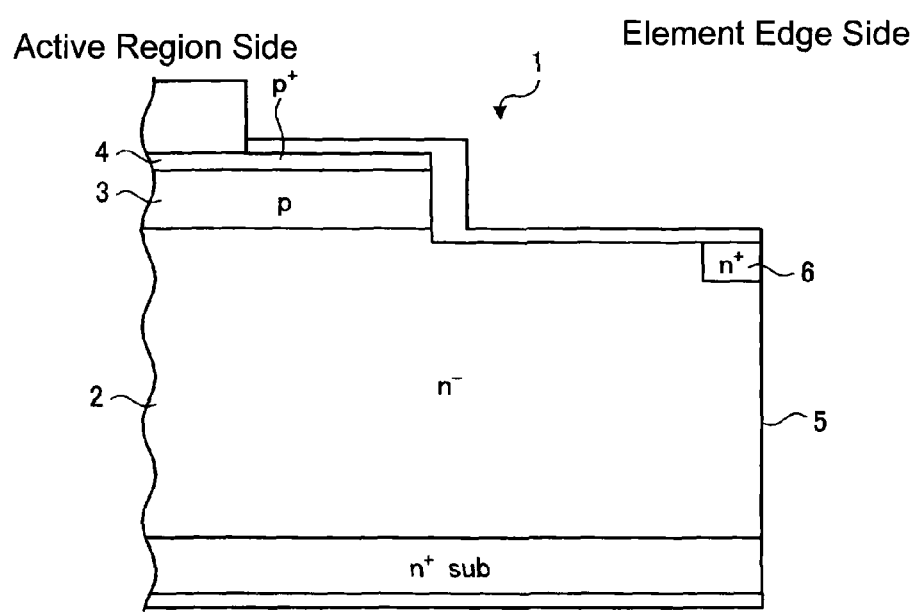
FIG. 13 is a sectional view showing the configuration of a peripheral voltage withstanding structure portion of a bevel structure according to the background art.

Description will be made about a result of comparison in the length of the peripheral voltage withstanding structure portion, electric characteristic and long-term reliability between the MOSFET according to the first embodiment (hereinafter referred to as Example 1) and the MOSFET having the peripheral voltage withstanding structure portion of the bevel structure according to the background art shown in FIG. 13 (hereinafter referred to as Comparative Example 1). In both Example 1 and Comparative Example 1, SiC was used as a semiconductor material and the withstand voltage class was 1200 V. In Example 1, the chip size was 3 mm square and the active area was 7.85 mm². The configuration of the active region portion in Example 1 was equal to that of the active region portion in Comparative Example 1, so that each MOSFET was provided as a vertical MOSFET having a trench gate structure.

The peripheral voltage withstanding structure portion in Example 1 was 45 µm long. On the other hand, the peripheral voltage withstanding structure portion in Comparative Example 1 was 260 µm long and about six times as long as that in Example 1. The reason why the peripheral voltage withstanding structure portion in Example 1 could be made remarkably shorter than that in Comparative Example 1 was that the sidewall and bottom of the 40 µm-wide trench in the peripheral voltage withstanding structure portion were covered with the insulating film to thereby absorb a large part of the drain voltage.

Figure 9:
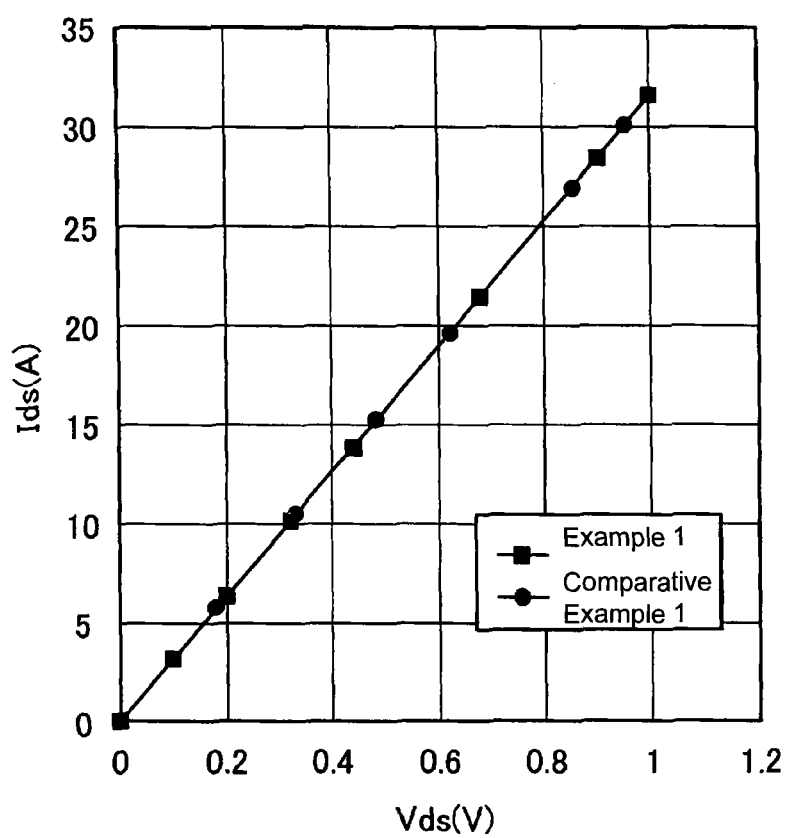
FIG. 9 is a characteristic graph showing results of measurement of electric characteristic in Example 1 according to the invention and Comparative Example 1 according to the background art.

FIG. 9 is a characteristic graph showing results of measurement of electric characteristic in Example 1 and Comparative Example 1. It was obvious from FIG. 9 that almost the same I-V characteristic was obtained in both Example 1 and Comparative Example 1. In Example 1, on-resistance (RonA) was 2.50 mΩcm² and the initial element withstand voltage was 1250 V. In Comparative Example 1, on-resistance (RonA) was 2.47 mΩcm² and the initial element withstand voltage was 1265 V. As described above, the on-resistance (RonA) and the initial element withstand voltage were almost the same in both Example 1 and Comparative Example 1, and sufficiently good characteristic of a 1200 V element was obtained in each of Example 1 and Comparative Example 1.

Figure 10:
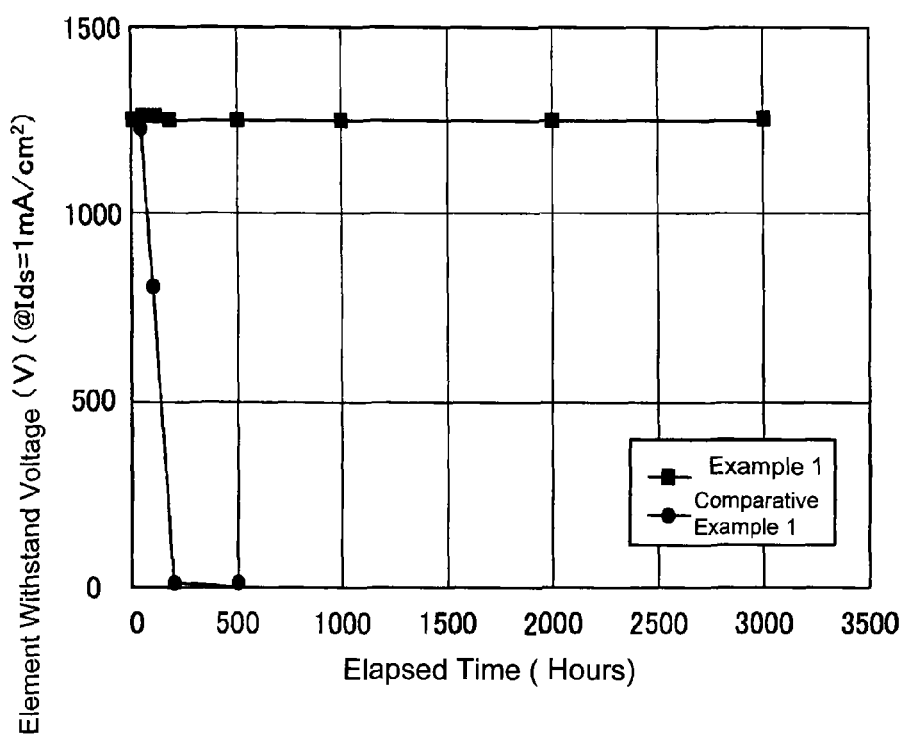
FIG. 10 is a characteristic graph showing results of a long-term reliability test in Example 1 and Comparative Example 1.

FIG. 10 is a characteristic graph showing results of a long-term reliability test in Example 1 and Comparative Example 1. On this occasion, a high temperature voltage application test was used as the long-term reliability test. The MOSFET in Example 1 and the MOSFET in Comparative Example 1 were individually assembled by molding. Change of the element withstand voltage was measured in the condition that a voltage of 1200 V was continuously applied between the source and the drain of each MOSFET in an atmosphere at 125° C. As is obvious from FIG. 10, the element withstand voltage in Example 1 little changed even after the passage of 3000 hours. On the other hand, the element withstand voltage in Comparative Example 1 began to deteriorate at a time point of the passage of 96 hours and was lowered rapidly after the time point. As described above, it was found that long-term reliability in Example 1 was remarkably higher than that in Comparative Example 1.

Embodiment 2

Figure 11:
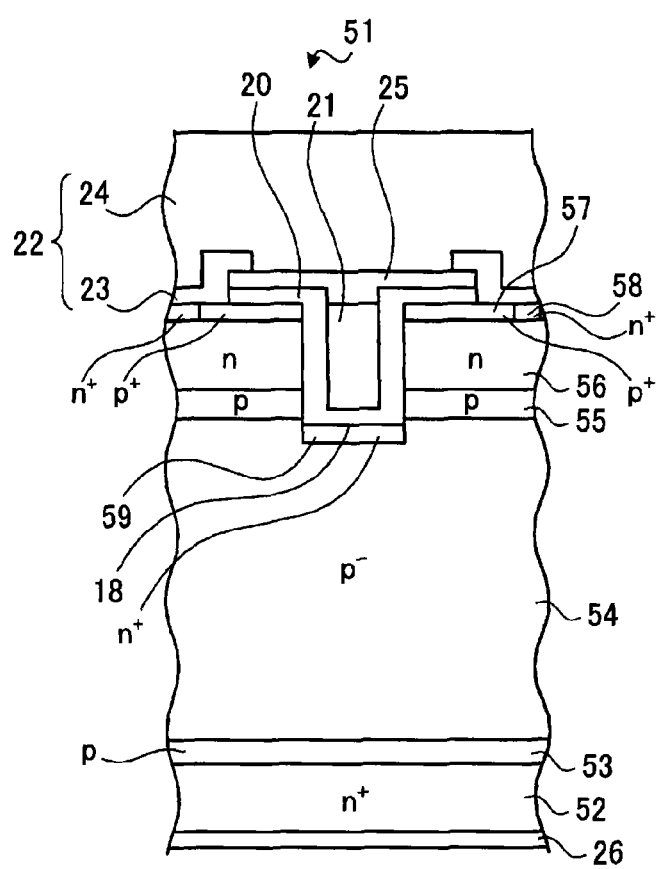
FIG. 11 is a sectional view showing the configuration of an active region portion of a semiconductor device according to a second embodiment of the invention.
Figure 12:
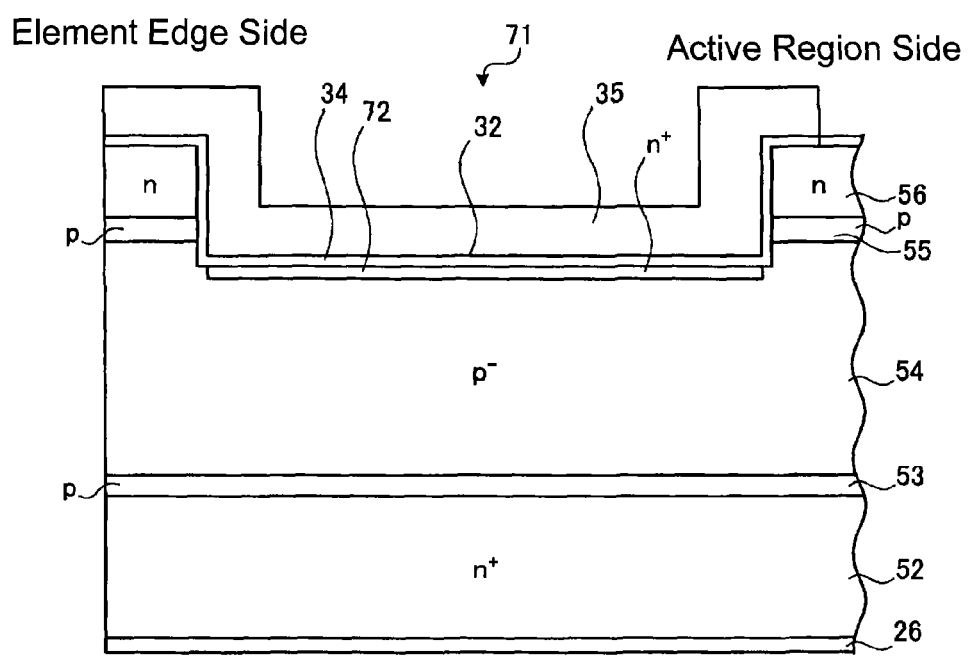
FIG. 12 is a sectional view showing the configuration of a peripheral voltage withstanding structure portion of the semiconductor device according to a second embodiment of the invention.

FIGS. 11 and 12 are sectional views showing the respective configurations of an active region portion and a peripheral voltage withstanding structure portion in a semiconductor device according to the second embodiment. Description will be made on the case where a trench gate type IGBT of a 1200V withstand voltage class is taken as an example though the semiconductor device is not particularly limited thereto. The active region portion and the peripheral voltage withstanding structure portion are formed in one and the same semiconductor substrate. The semiconductor device is produced from SiC. The first conductivity type is a p type and the second conductivity type is an n type.

Generally, the IGBT using SiC is of a p channel type. This is because the resistance of a p-type SiC substrate is so high that an n-type IGBT produced by use of this substrate is said to be impractical due to a very large voltage drop in the substrate. Therefore, the second embodiment will be described on the case where the p channel IGBT is taken as an example.

As shown in FIG. 11, in the active region portion 51, a p buffer layer 53 is provided on an n⁺ SiC layer 52. For example, the n⁺ SiC layer 52 contains about $2 \times 10^{18}$ cm⁻³ of nitrogen as an impurity. For example, the p buffer layer 53 contains about $2 \times 10^{17}$ cm⁻³ of aluminum as an impurity. For example, the thickness of the p buffer layer 53 is about 1 µm. A p⁻ SiC layer 54 is provided on the p buffer layer 53. For example, the p⁻ SiC layer 54 contains about $1.0 \times 10^{16}$ cm⁻³ of aluminum as an impurity. For example, the thickness of the p⁻ SiC layer 54 is about 10 µm.

A p SiC layer 55 is provided on the p⁻ SiC layer 54. For example, the p SiC layer 55 contains about $2.0 \times 10^{17}$ cm⁻³ of aluminum as an impurity. For example, the thickness of the p SiC layer 55 is about 0.5 µm. An n SiC layer 56 is provided on the p SiC layer 55. For example, the n SiC layer 56 contains about $2.1 \times 10^{17}$ cm⁻³ of nitrogen as an impurity. For example, the thickness of the n SiC layer 56 is about 2.5 µm.

A p⁺ source region 57 and an n⁺ contact region 58 are individually selectively provided on the n SiC layer 56. For example, the p⁺ source region 57 contains aluminum as an impurity. For example, the n⁺ contact region 58 contains phosphorus as an impurity. Trenches 18 are formed so that each trench 18 passes through the p⁺ source region 57, the n SiC layer 56 and the p SiC layer 55 and reaches the p⁻ SiC layer 54. The trenches 18 are the same as those in the first embodiment.

For example, an n⁺ SiC region 59 is provided along the bottom of each trench 18 so as to be located under the trench 18. For example, the n⁺ SiC region 59 contains about $2.0 \times 10^{19}$ cm⁻³ of nitrogen as an impurity. For example, the provision of the n⁺ SiC region 59 makes it possible to prevent the oxide film (a part of the gate oxide film) in the bottom of each trench 18 from being destroyed by an electric field concentrated into the bottom of the trench 18 when a high voltage is applied between an emitter and a collector.

The trench gate structure made up of each trench 18, the gate oxide film 20 and the gate electrode 21 is the same as that in the first embodiment. The electrode serving as a source electrode in the first embodiment is provided as an emitter electrode. With respect to the emitter electrode, the source electrode 22 in the description of the first embodiment can be replaced by the emitter electrode 22. The electrode serving as a drain electrode in the first embodiment is provided as a collector electrode under the n⁺ SiC layer 52. With respect to the collector electrode, the drain electrode 26 in the description of the first embodiment can be replaced by the collector electrode 26. Incidentally, the collector electrode 26 is made of titanium/aluminum (Ti/Al) having low contact resistance with the n⁺ SiC layer 52.

As shown in FIG. 12, in the peripheral voltage withstanding structure portion 71, a semiconductor-laminated structure composed of an n⁺ SiC layer 52, a p buffer layer 53, a p⁻ SiC layer 54, a p SiC layer 55 and an n SiC layer 56 and a collector electrode 26 are provided in the same manner as in the active region portion 51. The n⁺ SiC layer 52 is equivalent to a fifth semiconductor layer. The p buffer layer 53 and the p⁻ SiC layer 54 are equivalent to a first semiconductor layer. The p SiC layer 55 is equivalent to a second semiconductor layer. The n SiC layer 56 is equivalent to a third semiconductor layer.

For example, one trench 32, which passes through the n SiC layer 56 and the p SiC layer 55 and reaches the p⁻ SiC layer 54, is formed. The trench 32 is the same as that in the first embodiment. For example, an n⁺ SiC region 72 is provided along the bottom of the trench 32 so as to be located under the trench 32. The n⁺ SiC region 72 is equivalent to a fourth semiconductor layer. The n⁺ SiC region 72 is the same as the p⁺ SiC region 33 in the first embodiment. The p⁺ SiC region 33 in the description of the first embodiment can be replaced by the n⁺ SiC region 72 except that, for example, the n⁺ SiC region 72 contains about $2.0 \times 10^{19}$ cm$^{-3}$ of nitrogen as an impurity. The sidewall and bottom of the trench 32 are covered with an oxide film 34 and an insulating film such as an insulating film 35 of polyimide or the like in the same manner as in the first embodiment. The thicknesses and reasons of the oxide film 34 and the insulating film 35 are the same as those in the first embodiment.

First, an n-type SiC semiconductor substrate, for example, containing about $2 \times 10^{18}$ cm$^{-3}$ of nitrogen is prepared as shown in FIGS. 11 and 12. The n⁺ SiC substrate is provided as an n⁺ SiC layer 52. In the active region portion 51 and the peripheral voltage withstanding structure portion 71, a p buffer layer 53, a p⁻ SiC layer 54, a p SiC layer 55 and an n SiC layer 56 are epitaxially grown in this order on the n⁺ SiC substrate. The impurity type, impurity concentration and thickness of each layer are as described above.

Then, in the active region portion 51, an n⁺ contact region 58, a p⁺ source region 57, each trench 18, an n⁺ SiC region 59, a gate oxide film 20, a gate electrode 21, an interlayer insulating film 25, an emitter electrode 22 and a collector electrode 26 are formed in the same manner as in the first embodiment. On the other hand, in the peripheral voltage withstanding structure portion 71, a trench 32 and an n⁺ SiC region 72 are respectively formed in concurrence with the formation of the trench 18 and the n⁺ SiC region 59 in the active region portion 51, and an oxide film 34 is formed in concurrence with the formation of the gate oxide film 20 and covered with an insulating film 35. Finally, the semiconductor device is covered with a passivation film (not shown) to complete an IGBT having the configuration shown in FIGS. 11 and 12.

Description will be made about a result of comparison in the length of the peripheral voltage withstanding structure portion, electric characteristic and long-term reliability between the IGBT according to the second embodiment (hereinafter referred to as Example 2) and the IGBT having the peripheral voltage withstanding structure portion of the bevel structure according to the background art shown in FIG. 13 (hereinafter referred to as Comparative Example 2). In both Example 2 and Comparative Example 2, SiC was used as a semiconductor material and the withstand voltage class was 1200 V. In Example 2, the chip size was 3 mm square and the active area was 7.85 mm². The configuration of the active region portion in Example 2 was equal to that of the active region portion in
Comparative Example 2, so that each IGBT was provided as a vertical IGBT having a trench gate structure.

The peripheral voltage withstanding structure portion in Example 2 was 85 μm long. On the other hand, the peripheral voltage withstanding structure portion in Comparative Example 2 was 110 μm long. As a result of measurement of electric characteristic, in Example 2, the on-voltage at 10 A current conduction was −3.60 V and the initial element withstand voltage was −1250 V. In Comparative Example 2, the on-voltage at 10 A current conduction was −3.62 V and the initial element withstand voltage was −1245 V. As described above, the on-voltage and the initial element withstand voltage were almost the same in both Example 2 and Comparative Example 2, and sufficiently good characteristic of a 1200 V element was obtained in each of Example 2 and Comparative Example 2.

As a long-term reliability test, a high temperature voltage application test was performed while a voltage of 1200 V was continuously applied between the emitter and the collector of each IGBT in the same condition as in the first embodiment. As a result, the element withstand voltage in Example 2 little changed even after the passage of 3000 hours. On the other hand, the element withstand voltage in Comparative Example 2 began to deteriorate at a time point of the passage of 200 hours and was lowered rapidly after the time point. As described above, it was found that long-term reliability in Example 2 was remarkably higher than that in Comparative Example 2.

Embodiment 3

In the third embodiment, GaN is used as a semiconductor material in place of SiC used in the first embodiment. The configuration of the MOSFET is the same as in the first embodiment except that a different semiconductor material is used. Accordingly, with respect to the description of the configuration and producing process in the third embodiment, SiC in the description of the first embodiment can be replaced by GaN.

Incidentally, a substrate, for example, containing about $2 \times 10^{18}$ cm$^{-3}$ of silicon is prepared as an n-type GaN semiconductor substrate which serves as an n⁺ GaN layer (corresponding to the n⁺ SiC layer 12 in the first embodiment). The impurity to be imported into a p GaN layer, a p⁺ contact region and a p⁺ GaN region (corresponding to the p SiC layer 15, the p⁺ contact region 17 and the p⁺ SiC region 19 respectively in Embodiment 1) is changed to magnesium.

Description will be made about a result of comparison in the length of the peripheral voltage withstanding structure portion, electric characteristic and long-term reliability between the MOSFET according to the third embodiment (hereinafter referred to as Example 3) and the MOSFET having the peripheral voltage withstanding structure portion of the bevel structure according to the background art shown in FIG. 13 (hereinafter referred to as Comparative Example 3). In both Example 3 and Comparative Example 3, GaN was used as a semiconductor material and the withstand voltage class was 1200 V. In Example 3, the chip size was 3 mm square and the active area was 7.85 mm². The configuration of the active region portion in Example 3 was equal to that of the active region portion in Comparative Example 3, so that each MOSFET was provided as a vertical MOSFET having a trench gate structure.

The peripheral voltage withstanding structure portion in Example 3 was 45 µm long. On the other hand, the peripheral voltage withstanding structure portion in Comparative Example 3 was 58 µm long. As a result of measurement of electric characteristic, in Example 3, on-resistance (RonA) was 2.70 mΩcm² and the initial element withstand voltage was 1350 V. In Comparative Example 3, on-resistance (RonA) was 2.72 mΩcm² and the initial element withstand voltage was 1365 V. As described above, the on-resistance (RonA) and the initial element withstand voltage were almost the same in both Example 3 and Comparative Example 3, and sufficiently good characteristic of a 1200 V element was obtained in each of Example 3 and Comparative Example 3.

As a long-term reliability test, a high temperature voltage application test was performed in the same condition as in the first embodiment. As a result, the element withstand voltage in Example 3 little changed even after the passage of 3000 hours. On the other hand, the element withstand voltage in Comparative Example 3 began to deteriorate at a time point of the passage of 96 hours and was lowered rapidly after the time point. As described above, it was found that long-term reliability in Example 3 was remarkably higher than that in Comparative Example 3.

Embodiment 4

In the fourth embodiment, GaN is used as a semiconductor material in place of SiC used in the second embodiment. The configuration of the IGBT is the same as in the second embodiment except that a different semiconductor material is used and the conductivity type is inverted. Accordingly, with respect to the description of the configuration and producing process in the fourth embodiment, SiC in the description of the second embodiment can be replaced by GaN while the conductivity type is inverted.

Incidentally, a substrate, for example, containing about $2 \times 10^{18}$ cm$^{-3}$ of magnesium is prepared as a p-type GaN semiconductor substrate which serves as a p$^+$ GaN layer (corresponding to the n$^+$ SiC layer 52 in the second embodiment). The impurity to be imported into an n buffer layer, an n$^-$ GaN layer, an n GaN layer and an n$^+$ source region (corresponding to the p buffer layer 53, the p$^-$ SiC layer 54, the p SiC layer 55 and the p$^+$ source region 57 respectively in the second embodiment) is changed to silicon. The collector electrode (corresponding to the collector electrode 26 in the second embodiment) is made of titanium/aluminum having low contact resistance with the p$^+$ GaN layer.

Description will be made about a result of comparison in the length of the peripheral voltage withstanding structure portion, electric characteristic and long-term reliability between the IGBT according to the fourth embodiment (hereinafter referred to as Example 4) and the IGBT having the peripheral voltage withstanding structure portion of the bevel structure according to the background art shown in FIG. 13 (hereinafter referred to as Comparative Example 4). In both Example 4 and Comparative Example 4, GaN was used as a semiconductor material and the withstand voltage class was 1200 V. In Example 4, the chip size was 3 mm square and the active area was 7.85 mm². The configuration of the active region portion in Example 4 was equal to that of the active region portion in Comparative Example 4, so that each IGBT was provided as a vertical IGBT having a trench gate structure.

The peripheral voltage withstanding structure portion in Example 4 was 85 µm long. On the other hand, the peripheral voltage withstanding structure portion in Comparative Example 4 was 110 µm long. As a result of measurement of electric characteristic, in Example 4, the on-voltage at 10 A current conduction was 3.90 V and the initial element withstand voltage was 1350 V. In Comparative Example 4, the on-voltage at 10 A current conduction was 3.92 V and the initial element withstand voltage was 1345 V. As described above, the on-voltage and the initial element withstand voltage were almost the same in both Example 4 and Comparative Example 4, and sufficiently good characteristic of a 1200 V element was obtained in each of Example 4 and Comparative Example 4.

As a long-term reliability test, a high temperature voltage application test was performed in the same condition as in the second embodiment. As a result, the element withstand voltage in Example 4 little changed even after the passage of 3000 hours. On the other hand, the element withstand voltage in Comparative Example 4 began to deteriorate at a time point of the passage of 200 hours and was lowered rapidly after the time point. As described above, it was found that long-term reliability in Example 4 was remarkably higher than that in Comparative Example 4.

As described above, in accordance with each of the embodiments, the semiconductor device can be produced easily because the peripheral voltage withstanding structure portion is configured so that the sidewall and bottom of the trench 32 wider than each trench 18 in the active region portion are covered with the oxide film 34 and the insulating film 35. Moreover, high reliability can be obtained. Moreover, the length of the peripheral voltage withstanding structure portion can be reduced to be almost equal to the width of the trench in the peripheral voltage withstanding structure portion. In addition, it is unnecessary to provide a depletion layer stretching prevention region (a region equivalent to the n$^+$ region 6 in FIG. 13) in the element edge portion because each of the n SiC layer 14 in the first embodiment, the p SiC layer 55 in the second embodiment, the n GaN layer in the third embodiment and the n GaN layer in the fourth embodiment serves as a stopper of a depletion layer in the peripheral voltage withstanding structure portion.

In the above description, the invention is not limited to the aforementioned embodiments and can be changed variously. For example, size, concentration, temperature, time, etc. have been described in each embodiment by way of example but the invention is not limited to those values. A plurality of trenches may be formed in the peripheral voltage withstanding structure portion so that each trench in the peripheral voltage withstanding structure portion is covered with an insulating film as described above. In addition, each of the embodiments can be effectuated similarly even when the conductivity type (n type or p type) of each semiconductor layer or semiconductor region is inverted.

As described above, the semiconductor device according to the invention is usefully applied to power semiconductor devices used in power converters such as inverters or the like, power supply devices of various industrial machines or the like, igniters of cars, etc.

The invention has been described with reference to certain preferred embodiments thereof. It will be understood, however, that modifications and variations are possible within the scope of the appended claims.

This application is based on, and claims priority to, Japanese Patent Application No: 2007-289767, filed on Nov. 7, 2007. The disclosure of the priority application, in its entirety, including the drawings, claims, and the specification thereof, is incorporated herein by reference.

What is claimed is:

1. A semiconductor device produced from a semiconductor material having a wider bandgap than that of silicon, the semiconductor device comprising:
    an active region portion in which an electric current flows; and
    a peripheral voltage withstanding structure portion surrounding the outside of the active region portion;
    wherein the peripheral voltage withstanding structure portion includes:
    a first semiconductor layer of a first conductivity type;
    a second semiconductor layer of the first conductivity type which is provided on the first semiconductor layer of the first conductivity type so that the second semiconductor layer of the first conductivity type has a higher impurity concentration than that of the first semiconductor layer of the first conductivity type;
    a third semiconductor layer of a second conductivity type which is provided on the second semiconductor layer of the first conductivity type;
    at least one trench which passes through the third semiconductor layer of the second conductivity type and the second semiconductor layer of the first conductivity type and reaches the first semiconductor layer of the first conductivity type; and
    an insulating film with which an inner surface of the trench is covered.

2. A semiconductor device according to claim 1, wherein the active region portion includes:
    the first semiconductor layer of the first conductivity type;
    the second semiconductor layer of the first conductivity type which is provided on the first semiconductor layer of the first conductivity type so that the second semiconductor layer of the first conductivity type has a higher impurity concentration than that of the first semiconductor layer of the first conductivity type;
    the third semiconductor layer of the second conductivity type which is provided on the second semiconductor layer of the first conductivity type;
    at least one gate trench which passes through the third semiconductor layer of the second conductivity type and the second semiconductor layer of the first conductivity type and reaches the first semiconductor layer of the first conductivity type;
    a source region of the first conductivity type which is provided on the third semiconductor layer of the second conductivity type so as to be in contact with a sidewall of the gate trench;
    a gate insulating film with which an inner surface of the gate trench is covered; and
    a control electrode which is provided on an inner surface of the gate insulating film.

3. A semiconductor device according to claim 1, wherein the number of the trenches provided in the peripheral voltage withstanding structure portion is one.

4. semiconductor device according to claim 1, wherein a fourth semiconductor layer of the second conductivity type is provided along a bottom of the trench so as to be located under the trench.

5. A semiconductor device according to claim 4, wherein the fourth semiconductor layer of the second conductivity type is provided along only a part of the bottom of the trench.

6. A semiconductor device according to claim 2, wherein the width of the trench is wider than that of the gate trench.

7. A semiconductor device according to any one of claim 1, wherein a fifth semiconductor layer of the second conductivity type is provided under the first semiconductor layer of the first conductivity type.

8. A semiconductor device according to claim 1, wherein the insulating film with which the inner surface of the trench in the peripheral voltage withstanding structure portion is covered has a thickness not smaller than 1.1 μm.

9. A semiconductor device according to claim 1, wherein the semiconductor material is silicon carbide.

10. A semiconductor device according to claim 1, wherein the semiconductor material is gallium nitride.

* * * * *